United States Patent
Szelag et al.

(10) Patent No.: US 11,211,546 B1
(45) Date of Patent: Dec. 28, 2021

(54) PARYLENE COATING PROCESS FOR TEMPERATURE SENSITIVE COMPONENTS

(71) Applicants: The United States of America as represented by the Secretary of the Navy, Newport, RI (US); Pamela Benjamin, Somerset, MA (US)

(72) Inventors: Jeffrey A Szelag, Tiverton, RI (US); Michael R Zarnetske, Bristol, RI (US); Kim C Benjamin, Somerset, MA (US)

(73) Assignee: The United States of America as represented by the Secretary of the Navy

( * ) Notice: Subject to any disclaimer, the term of this patent is extended or adjusted under 35 U.S.C. 154(b) by 0 days.

(21) Appl. No.: 16/897,536

(22) Filed: Jun. 10, 2020

(51) Int. Cl.
| | |
|---|---|
| *B05D 7/24* | (2006.01) |
| *H01L 41/23* | (2013.01) |
| *B08B 3/08* | (2006.01) |
| *B05D 7/00* | (2006.01) |
| *B05D 3/02* | (2006.01) |
| *B05D 3/04* | (2006.01) |
| *C09D 147/00* | (2006.01) |
| *B05D 5/00* | (2006.01) |
| *H01L 41/053* | (2006.01) |
| *H01L 41/08* | (2006.01) |
| *H01L 41/18* | (2006.01) |
| *C09D 175/04* | (2006.01) |
| *B05D 3/10* | (2006.01) |

(52) U.S. Cl.
CPC ............ *H01L 41/23* (2013.01); *B05D 3/0218* (2013.01); *B05D 3/0406* (2013.01); *B05D 3/108* (2013.01); *B05D 5/00* (2013.01); *B05D 7/24* (2013.01); *B05D 7/544* (2013.01); *B08B 3/08* (2013.01); *C09D 147/00* (2013.01); *C09D 175/04* (2013.01); *H01L 41/0533* (2013.01); *H01L 41/0825* (2013.01); *H01L 41/183* (2013.01)

(58) Field of Classification Search
CPC .............. H01L 41/23; B05D 5/10; B08B 3/08
See application file for complete search history.

*Primary Examiner* — Austin Murata

(74) *Attorney, Agent, or Firm* — James M. Kasischke; Michael P. Stanley

(57) ABSTRACT

A method for applying a waterproof coating to a transducer component includes the steps of cleaning and promoting bonding on the transducer component by immersing the component in a mixture of isopropyl alcohol, deionized water, and siline. The component is then air dried and rinsed in pure isopropyl alcohol. After drying, the component is vacuum baked and subjected to a vacuum for twelve hours. A parylene coating is provided to the component surface. The parylene coating is abraded, and the surface is rinsed with pure isopropyl alcohol. After drying, polyurethane is provided on the abraded parylene surface. The polyurethane is cured to form a waterproof coating on the transducer component. In further embodiments, a second parylene coating can be provided outside the polyurethane.

5 Claims, 1 Drawing Sheet

PARYLENE COATING PROCESS FOR TEMPERATURE SENSITIVE COMPONENTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of the Invention

The present invention is directed to a process for applying a waterproof coating and more particularly to a process for applying a waterproof coating to temperature sensitive components.

(2) Description of the Prior Art

The active material in sonar transducer elements and arrays is electrically sensitive dielectric material. This active material is often a piezoelectric material such as a piezoelectric composite or a crystalline piezoelectric material. When these transducer elements are used in an aqueous environment, some form of waterproofing is required that physically shields the active material and is acoustically transparent over the intended frequency range of operation.

A window or boot made from rubber or polyurethane is commonly utilized for waterproofing. A nonconductive fill fluid such as oil can also be provided between the window or boot and the active component. Because of its better wear characteristics and ease of application, a polymer coating such as polyurethane has become the window material of choice. The downside of such polymer coatings is their propensity to absorb water over time. Polyurethane is known to absorb up to 3.0% of its weight in water when subjected to a 24-hour soak at 200° F. This water absorption creates a need for a thicker, more robust coating which does not degrade acoustic performance, yet provides additional water blocking capabilities.

A known coating material utilized for waterproofing is parylene. Parylene is the trade name for poly(p-xylylene) polymers which are typically deposited by chemical vapor processes. These are used for moisture and dielectric barriers for electronic components. Parylene is typically soft and features poor stability when subjected the undersea environment.

The purpose of the subject patent is to provide a process for providing a waterproof coating of piezoelectric transducer assemblies that maintains waterproofing beyond two years without significant degradation.

SUMMARY OF THE INVENTION

It is an object of the present invention to provide an acoustically transparent, waterproof coating for a transducer component.

Accordingly, there is provided a method for applying a waterproof coating to a transducer component. The method includes the steps of cleaning and promoting bonding on the transducer component by immersing the component in a mixture of isopropyl alcohol, deionized water, and siline. The component is then air dried and rinsed in pure isopropyl alcohol. After drying, the component is vacuum baked and subjected to a vacuum for twelve hours. A parylene coating is provided to the component surface. The parylene coating is abraded, and the surface is rinsed with pure isopropyl alcohol. After drying, polyurethane is provided on the abraded parylene surface. The polyurethane is cured to form a waterproof coating on the transducer component. In further embodiments, a second parylene coating can be provided outside the polyurethane.

BRIEF DESCRIPTION OF THE DRAWINGS

Reference is made to the accompanying drawings in which are shown an illustrative embodiment of the invention, wherein corresponding reference characters indicate corresponding parts, and wherein.

DETAILED DESCRIPTION OF THE INVENTION

The embodied method proposes a waterproof coating for an electronic component. The electronic component can be any component sensitive to water exposure in a submerged environment. This is particularly applicable to acoustic components such as transducers because acoustic transparency is required, and parylene provides a thin moisture barrier that does not adversely affect acoustic transmission.

Figure 1:
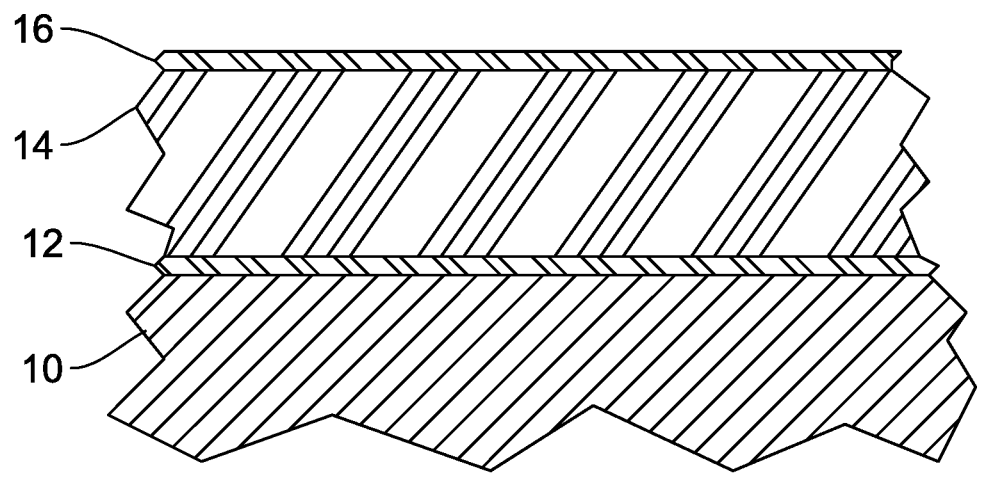
FIG. 1 is a cross-sectional view of a first embodiment.

FIG. 1 illustrates a first embodiment of a coated component 10. The waterproof coating process preferably includes coating a component 10 with a first parylene layer 12, providing a polyurethane coating 14 outside first parylene layer 12, and providing a second parylene layer 16 outside polyurethane coating layer 14.

A primary objective of this embodiment is obtaining proper bonding between component 10 and first parylene layer 12 and between polyurethane layer 14 and second parylene layer 16. In a typical embodiment, first parylene layer is about 0.002-0.005" thick, polyurethane layer is about 0.08-0.12" thick, and second parylene layer is about 0.002-0.005" thick.

The component is typically a composite piezoelectric transducer. Composite piezoelectric transducers typically include ceramic active piezoelectric elements in a resilient matrix. Electrodes are usually plated on the matrix and piezoelectric elements. Thus, the parylene coating will need to adhere to potentially three different types of surfaces.

Figure 2:
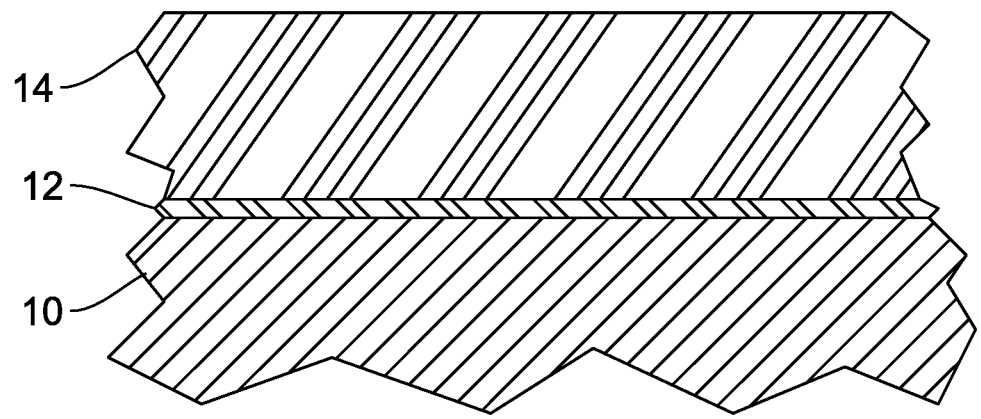
FIG. 2 is a cross-sectional view of a second embodiment.

FIG. 2 illustrates a second embodiment of a coated component 10. In this embodiment, a parylene layer 12 is applied to component 10. Polyurethane layer 14 is provided on top of parylene layer 12. This embodiment doesn't feature a second parylene layer outside of polyurethane layer 14.

As an initial step, the surface of component 10 is prepared for deposition of the parylene. The component is totally immersed in a mixture of isopropyl alcohol, deionized water, and siline (also known as silabenzene). Preferably these constituents are provided in volume percentages of 49.5% isopropyl alcohol, 49.5% deionized water, and 1% siline. Siline provides stability across a wider temperature range than simple deionized water and isopropyl alcohol. Immersion should occur for about 45 minutes.

The component is then air-dried at ambient temperature (about 10-30° C.) and ambient pressure (1 atmosphere) for 45 minutes. After air-drying, the component is given a five minute immersion rinse with 100% isopropyl alcohol. Alcohol is removed from the surface of component 10 by blow drying using a conventional apparatus.

As another drying step, the component is baked at in a low pressure atmosphere for approximately six hours. The low pressure atmosphere should preferably be less than 29 inches of mercury at sea level. Baking the component in a low pressure atmosphere promotes evaporation and sublimation of liquids and volatiles. The temperature of the vacuum bake step must be modified to account for the melting point of the component materials, particularly any resilient matrix. Temperature resistant components should be vacuum baked at 70° C. Piezocomposite components should be vacuum baked at temperatures below 40° C. because otherwise the resilient matrix will thermoform. In either case, the component should be vacuum baked for about 12 hours.

Portions of electronic component, such as electrode contacts that are to be excluded from parylene coating must be masked. This can be performed either by using pressure-sensitive tape or bagging and sealing the portions to exclude them from the parylene coating process.

A first parylene layer 12 can now be applied to component 10 surface. Parylene can be applied by vaporizer, vaporizer with a bubbler, plasma methods, vacuum deposition and the like. After deposition, curing can be at elevated temperatures, at room temperature, or under ultraviolet light depending on the formulation of the particular parylene material.

After application of first parylene layer 12, polyurethane layer 14 is applied. The application surface of first parylene layer 12 must be abraded with a fine abrasive pad (i.e. 220 grit (or higher) sandpaper) to improve adhesion between the parylene and the polyurethane material. After abrasion, the surface should be cleaned with 100% isopropyl alcohol and allowed to dry by placing in a current of hot air. Polyurethane can now be applied or molded over the surface. After applying, the polyurethane is cured.

To provide added protection and further delay water absorption in the polyurethane, a second parylene layer is applied to the surface of the polyurethane layer. The surface of the polyurethane layer must be cleaned by immersion in the isopropyl alcohol, dionized water, and siline mixture described above for about 45 minutes. The surface should then be air dried and rinsed with 100% isopropyl alcohol. Alcohol should be removed by blow drying the surface. Unlike the application of the first parylene layer, vacuum baking is not used because it would damage the polyurethane. Electrical parts not intended for parylene coating should be masked to prevent coating with parylene. The polyurethane coated component should be maintained in a vacuum chamber for twelve hours to promote drying and degassing. Parylene can then be applied to the exterior of the polyurethane coating. The second parylene layer should then be cured.

A reliability experiment was performed utilizing piezo-composite-based transducers coated with vacuum-deposited parylene. Four 3.5×3.5×0.5-inch copper-plated piezocomposite samples were electrically evaluated while immersed in seawater. The four samples consisted of (1) a control without parylene, (2) parylene on the inner subassembly under the polyurethane encapsulant, (3) parylene over the polyurethane, and (4) Parylene both over and under the polyurethane.

The samples were connected to a data logging system that measures capacitance, dissipation, and insulation resistance at a regular programmed interval of six hours. Testing continued for 28 months of continuous immersion. The testing results showed that the control, sample 1, degraded within the first month. Within the first year, it was essentially unusable.

All the samples showed signs of water absorption in their respective polyurethane encapsulants after 28 months of seawater exposure. After 2 years of submergence, the external parylene coating broke down and melted off of samples 3 and 4. It was found that parylene that is placed over the component and under the polyurethane holds off water ingression longer than parylene coated externally over the polyurethane. Sample 4 with parylene placed over the component and then again over the encapsulant demonstrated the highest protection. This gives rise to the preferred embodiment in which parylene is applied to the component, polyurethane is applied over the parylene coating, and a second parylene layer is applied on top of the polyurethane coating.

An improved method for coating transducer assemblies is thus provided. This method provides an acoustically transparent coating while maintaining the durability of polyurethane. The parylene and polyurethane coating taught herein protects against polyurethane's tendency to absorb water and thus provides improved waterproofing characteristics.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive, nor to limit the invention to the precise form disclosed; and obviously, many modification and variations are possible in light of the above teaching. Such modifications and variations that may be apparent to a person skilled in the art are intended to be included within the scope of this invention as defined by the accompanying claims.

What is claimed is:

1. A method for applying a waterproof coating to a transducer component comprising:
    cleaning and promoting bonding on a surface of the transducer component by immersing the component in a mixture of isopropyl alcohol, deionized water, and siline;
    air drying the surface after removal from the mixture;
    rinsing the component in pure isopropyl alcohol;
    blow drying the component with air after rinsing the component in pure isopropyl alcohol;
    vacuum baking the component after said step of blow drying;
    subjecting the vacuum baked component to vacuum for twelve hours;
    applying a parylene coating to the surface of the vacuum baked component after said step of subjecting the vacuum baked component to vacuum;
    abrading the parylene coating;
    cleaning the abraded parylene coating with pure isopropyl alcohol;
    drying the cleaned, abraded parylene coating utilizing hot air;
    applying polyurethane to the dried, cleaned, and abraded parylene coating; and
    curing the applied polyurethane to form a waterproof coating on the transducer component.

2. The method of claim 1, wherein the mixture for cleaning and promoting bonding is 49.5% isopropyl alcohol, 49.5% deionized water, and 1% siline.

3. The method of claim 1, further comprising the steps of:
    abrading the waterproof coating on the transducer component;

immersing the abraded waterproof coated transducer component in a second mixture of isopropyl alcohol, deionized water, and siline;

air drying the surface of the waterproof coated transducer component after removal from the second mixture;

rinsing the waterproof coated transducer component in pure isopropyl alcohol;

blow drying the rinsed waterproof coated transducer component with air after rinsing;

subjecting the blow dried waterproof coated transducer component to vacuum for twelve hours; and applying a second parylene coating to the surface of the blow dried waterproof coated transducer component after said step of subjecting the blow dried waterproof coated transducer component to vacuum to give an additionally coated waterproof transducer component.

4. The method of claim 3, wherein the second mixture for cleaning and promoting bonding is 49.5% isopropyl alcohol, 49.5% deionized water, and 1% siline.

5. The method of claim 1, further comprising a step of masking portions of the transducer component.

* * * * *